US008232767B2

(12) United States Patent
Oh et al.

(10) Patent No.: US 8,232,767 B2
(45) Date of Patent: Jul. 31, 2012

(54) APPARATUS AND METHOD OF TESTING FOR BATTERY (75) Inventors: Jeon Keun Oh, Daejeon (KR); Joong Hui Lee, Daejeon (KR); Soo Yeup Jang, Daejeon (KR)

(73) Assignee: SK Innovation Co., Ltd., Seoul (KR)

( * ) Notice: Subject to any disclaimer, the term of this patent is extended or adjusted under 35 U.S.C. 154(b) by 898 days.

(21) Appl. No.: 12/095,066

(22) PCT Filed: Nov. 24, 2006

(86) PCT No.: PCT/KR2006/004991
§ 371 (c)(1),
(2), (4) Date: May 27, 2008

(87) PCT Pub. No.: WO2007/064110
PCT Pub. Date: Jun. 7, 2007

(65) Prior Publication Data
US 2008/0290877 A1 Nov. 27, 2008

(30) Foreign Application Priority Data

Dec. 2, 2005 (KR) .................. 10-2005-0116988

(51) Int. Cl.
*H02J 7/00* (2006.01)
*H02J 7/16* (2006.01)
*G01N 27/416* (2006.01)

(52) U.S. Cl. ........ 320/121; 320/119; 320/116; 320/165; 324/433; 324/432

(58) Field of Classification Search .................. 320/116, 320/119, 121, 117, 165; 324/426, 433, 430, 324/429, 500, 522, 523, 525, 537, 427, 428, 324/432
See application file for complete search history.

(56) References Cited

U.S. PATENT DOCUMENTS
5,479,085 A 12/1995 Honda et al.
(Continued)

FOREIGN PATENT DOCUMENTS
JP 10-285817 A 10/1998
(Continued)

OTHER PUBLICATIONS
Japanese Patent Application No. 2008-543185: Office Action, dated Dec. 20, 2011.

*Primary Examiner* — Edward Tso
*Assistant Examiner* — Alexis Boateng
(74) *Attorney, Agent, or Firm* — McDermott Will & Emery LLP (57) ABSTRACT The present invention relates to an apparatus and method for testing batteries, which can prevent errors from occurring due to the tolerance of voltage sensors when the charged states of batteries are measured, and can charge a battery having a charged state deteriorated due to the difference in the resistance of each battery. The apparatus includes a voltage circuit for measuring voltages of N batteries. A resistance circuit decreases voltages of batteries, which are greater than a reference voltage. A connection switch unit selects any one of the N batteries. A divert change unit separates polarities of each battery and changes positions of an cathode and a anode of the battery depending on separated polarities. A selection switch unit selectively connects the cathode and anode of the battery to an cathode and a anode of the voltage circuit or the resistance circuit.

24 Claims, 4 Drawing Sheets

U.S. PATENT DOCUMENTS

| | | | |
|---|---|---|---|
| 5,712,568 A * | 1/1998 | Flohr et al. | 324/434 |
| 5,818,905 A * | 10/1998 | Ohno | 379/30 |
| 5,994,873 A * | 11/1999 | Shiojima | 320/118 |
| 6,268,710 B1 * | 7/2001 | Koga | 320/116 |
| 6,362,627 B1 * | 3/2002 | Shimamoto et al. | 324/434 |
| 6,462,511 B1 * | 10/2002 | Kwok | 320/119 |
| 6,639,387 B2 | 10/2003 | Kitagawa et al. | |
| 6,639,408 B2 * | 10/2003 | Yudahira et al. | 324/434 |
| 6,677,758 B2 * | 1/2004 | Maki et al. | 324/429 |
| 7,135,836 B2 * | 11/2006 | Kutkut et al. | 320/116 |
| 7,714,540 B2 * | 5/2010 | Shibuya et al. | 320/119 |
| 2004/0189250 A1 * | 9/2004 | Nishida | 320/116 |
| 2011/0140674 A1 * | 6/2011 | Veselic et al. | 320/155 |

FOREIGN PATENT DOCUMENTS

| | | |
|---|---|---|
| JP | 2002-058169 A | 2/2002 |
| JP | 2002-369400 A | 12/2002 |
| JP | 2003-158827 A | 5/2003 |
| KR | 20-0330157 Y1 | 10/2003 |

* cited by examiner

APPARATUS AND METHOD OF TESTING FOR BATTERY

CROSS REFERENCE TO PRIOR APPLICATIONS

This application is the U.S. national phase of International Application No. PCT/KR2006/004991, filed Nov. 24, 2006, which claims priority from Korean Patent Application No. 10-2005-0116988, filed Dec. 2, 2005. The disclosure of both applications is incorporated herein by reference in their entirety. The International Application published in English on Jun. 7, 2007 as WO2007/064110 under PCT Article 21(2).

TECHNICAL FIELD

The present invention relates, in general, to an apparatus and method for testing batteries and, more particularly, to an apparatus and method for testing batteries, which can prevent errors from occurring due to the tolerance of voltage sensors when the charged states of individual batteries are measured, and can charge a battery having a charged state that is deteriorated due to the difference in the resistance of each battery.

BACKGROUND ART

Figure 1:
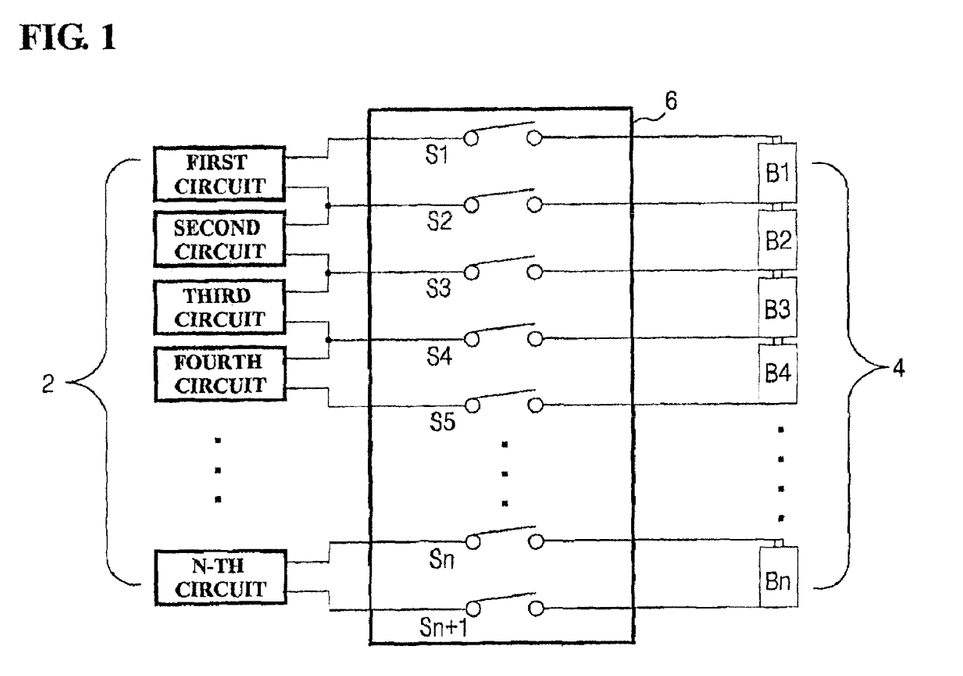
FIG. 1 is a diagram showing a conventional apparatus for testing batteries.

Research on secondary batteries enabling charge and discharge, unlike primary batteries, which typically cannot be charged, has been actively conducted, with the development of high-technology fields, such as digital cameras, cellular phones, notebook computers, and hybrid cars. Secondary batteries may include a nickel-cadmium battery, a nickel-metal hydride battery, a nickel-hydrogen battery, a lithium secondary battery, etc. The voltage of such a secondary battery is measured using a battery test apparatus, as shown in FIG. 1. When the measured voltage is less than or greater than a reference voltage, the battery is charged or discharged, and thus voltage balance is realized.

FIG. 1 is a diagram showing a conventional apparatus for testing batteries.

Referring to FIG. 1, the conventional battery test apparatus includes a switch unit 6 and a circuit unit 2.

The switch unit 6 is connected to N batteries 4, and functions to connect the batteries to the circuit unit 2. Such a switch unit 6 includes N+1 switches S1 to Sn+1. The first ends of the first to N-th switches S1 to Sn are connected to the cathodes of the first to N-th batteries B1 to Bn, respectively, and the N+1-th switch Sn+1 is connected to the anode of the N-th battery Bn.

The circuit unit 2 is implemented using voltage circuits or resistance circuits. That is, when the first to N-th circuits, included in the circuit unit 2, are voltage circuits, the circuit unit 2 measures the voltages of respective batteries B1 to Bn. When the first to N-th circuits are resistance circuits, the circuit unit 2 functions to decrease the voltages of the batteries measured by voltage circuits when the measured voltages are greater than a reference voltage.

DISCLOSURE

Technical Problem

Such a conventional battery test apparatus requires N voltage circuits to measure respective voltages of N batteries B1 to Bn. Further, as the number of batteries increases, the number of resistance circuits for decreasing the voltages of batteries charged (overcharged) to voltages greater than a reference voltage (for example, 3.6V) increases. Accordingly, when the conventional battery test apparatus measures the voltages of N batteries using N voltage circuits, measurement errors occur due to the tolerance of voltage sensors, and, in addition, differences between the voltages of the batteries occur according to the differences between the resistances of the resistance circuits because the voltages of the batteries are decreased using a plurality of resistance circuits. That is, the conventional battery test apparatus is problematic in that voltage balance between the batteries is not realized due to the differences between the plurality of circuits used in the circuit unit 2. Further, the conventional battery test apparatus is problematic in that, since it uses a plurality of circuits, the cost is increased. Furthermore, the conventional battery test apparatus is problematic in that it is difficult to charge a battery having a voltage less than the reference voltage.

Technical Solution

Accordingly, the present invention has been made keeping in mind the above problems occurring in the prior art, and an object of the present invention is to provide an apparatus and method for testing batteries, which can prevent errors from occurring due to the tolerance of voltage sensors when the charged states of individual batteries are measured, and can charge a battery having a charged state that is deteriorated due to the difference in the resistance of each battery.

ADVANTAGEOUS EFFECTS

The present invention is advantageous in that, since it reduces the number of voltage circuits and the number of resistance circuits, the cost can be decreased, and in that, since it measures the voltages of N batteries using a single voltage circuit, errors can be prevented from occurring due to the tolerance of voltage sensors when the charged states of the N batteries are measured.

Further, the present invention is advantageous in that it can charge a battery when the charged state thereof is deteriorated due to the difference in the resistance of each battery, that is, when the voltage of the battery is less than a reference voltage.

DESCRIPTION OF REFERENCE CHARACTERS OF IMPORTANT PARTS

| | |
|---|---|
| 2: circuit unit | 4, 14, 114, 214: battery |
| 6: switch unit | 10, 110: voltage circuit |
| 11, 111: resistance circuit | 12, 212: charging circuit |
| 16, 116, 216: connection switch unit | 18, 118, 218: divert change unit |
| 20, 120, 220: selection switch unit | 22, 122, 222: control unit |
| 24, 124, 224: display unit | |

BEST MODE

In accordance with an embodiment of the present invention to accomplish the above object, there is provided an apparatus for testing batteries, comprising at least one voltage circuit for measuring voltages of N batteries; at least one resistance circuit for decreasing voltages of batteries, which are greater than a reference voltage, among the N batteries; a connection switch unit connected to the N batteries and adapted to select any one of the N batteries; a divert change unit for separating polarities of each battery connected thereto through the connection switch unit and changing positions of an cathode and a anode of the battery depending on separated polarities; and a selection switch unit for selectively connecting the cathode and anode of the battery, separated by the divert change unit, to an cathode and a anode of the voltage circuit or the resistance circuit.

In accordance with another embodiment of the present invention to accomplish the above object, there is provided an apparatus for testing batteries, comprising at least one charging circuit for charging any one of N batteries, having voltages less than a reference voltage, to the reference voltage; a connection switch unit connected to the N batteries and adapted to select any one of the N batteries; a divert change unit for separating polarities of each battery connected thereto through the connection switch unit and changing positions of an cathode and a anode of the battery depending on separated polarities; and a selection switch unit for selectively connecting the cathode and anode of the battery separated by the divert change unit to an cathode and a anode of the charging unit, respectively.

In accordance with an embodiment of the present invention to accomplish the above object, there is provided a method of testing batteries, comprising the steps of selecting any one of N batteries; measuring a voltage of the selected battery; and decreasing the voltage of the battery when the measured voltage is greater than a reference voltage.

In accordance with another embodiment of the present invention to accomplish the above object, there is provided a method of testing batteries, comprising the steps of selecting any one of N batteries having voltages less than a reference voltage; and charging the selected battery to the reference voltage.

MODE FOR INVENTION

Hereinafter, embodiments of the present invention will be described in detail with reference to the attached drawings.

Figure 2:
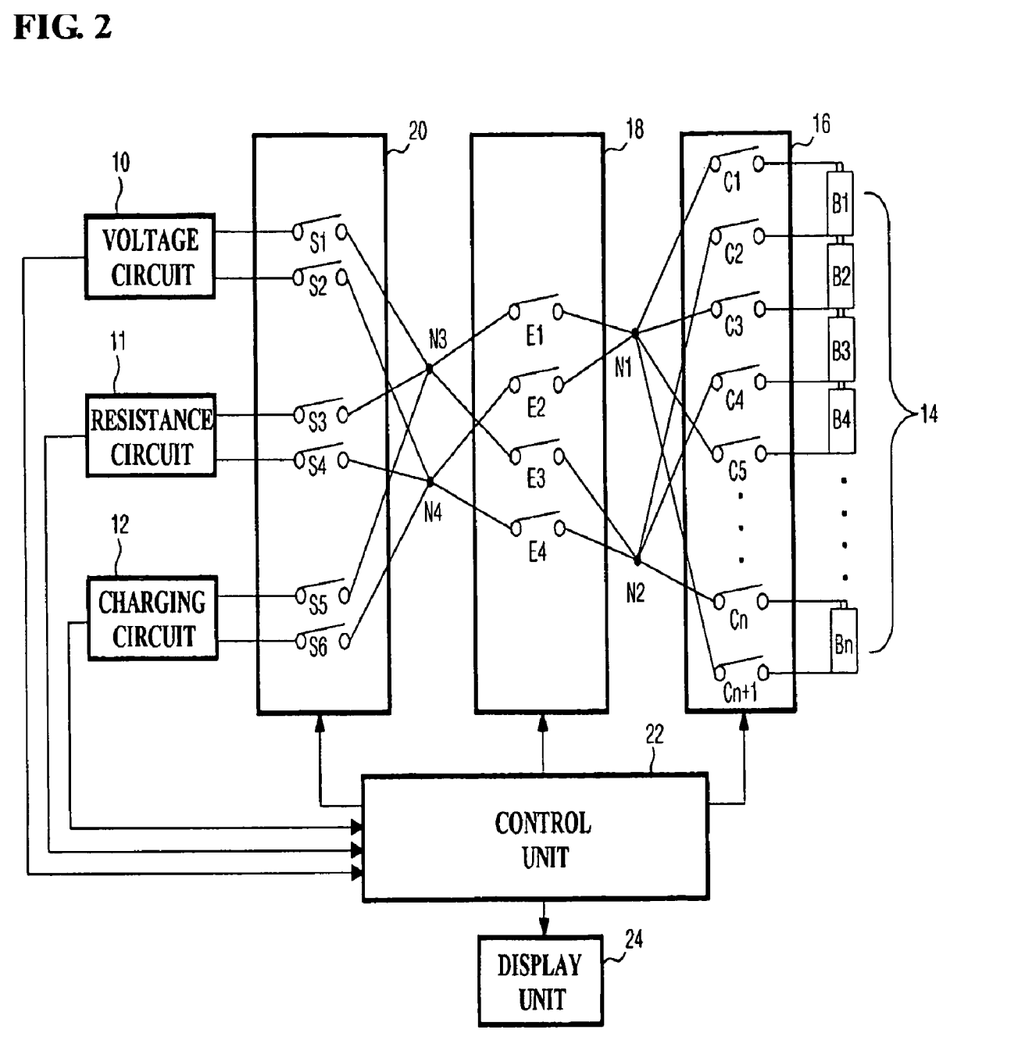
FIG. 2 is a diagram showing an apparatus for testing batteries according to a first embodiment of the present invention.

FIG. 2 is a diagram showing an apparatus for testing batteries according to a first embodiment of the present invention.

Referring to FIG. 2, the battery test apparatus according to the first embodiment of the present invention includes a voltage circuit 10, a resistance circuit 11, a charging circuit 12, a connection switch unit 16, a divert change unit 18, a selection switch unit 20, a control unit 22, and a display unit 24.

The voltage circuit 10 sequentially measures the voltages of N batteries B1 to Bn in response to the switching operations of the switches C1 to Cn+1, E1 to E4, and S1 to S6, included in the connection switch unit 16, the divert change unit 18, and the selection switch unit 20, which respond to control signals output from the control unit 22. Such a voltage circuit 10 supplies the measured voltages to the control unit 22.

The resistance circuit 11 functions to decrease the voltage of a corresponding battery when the voltage of the battery measured by the voltage circuit 10 is greater than a reference voltage. That is, the resistance circuit 11 discharges a battery having a voltage greater than the reference voltage, thus decreasing the battery voltage to the reference voltage. When decreasing the voltage of the battery, that is, when discharging the battery, the resistance circuit 11 provides a discharging signal to the control unit 22.

The charging circuit 12 functions to increase the voltage of a corresponding battery when the voltage of the battery measured by the voltage circuit 10 is less than the reference voltage. That is, the charging circuit 12 charges the battery having a voltage greater than the reference voltage, thus increasing the battery voltage to the reference voltage. When increasing the voltage of the battery, that is, when charging the battery, the charging circuit 12 provides a charging signal to the control unit 22.

The connection switch unit 16 includes N+1 switches, the first ends of which are connected to the cathodes of the N batteries B1 to Bn and the anode of the N-th battery, respectively, and functions to select any one from among the N batteries B1 to Bn in response to a switching control signal provided by the control unit 22. For this operation, the second ends of the odd-numbered switches C1, C3, C5, . . . , Cn+1 among N+1 switches C1 to Cn+1, which constitute the connection switch unit 16, are connected in common to a first node N1, and the second ends of the even-numbered connection switches C2, C4, C6, . . . , Cn thereof are connected in common to a second node N2. Accordingly, when the switching control signal from the control unit 22 is provided to the connection switch unit 16, the cathode and anode of any one of the N batteries B1 to Bn are connected to the first node N1 and the second node N2, respectively, or to the second node N2 and the first node N1, respectively. In other words, the cathodes of the odd-numbered batteries B1, B3, B5, . . . , Bn−1, and the anodes of the even-numbered batteries B2, B4, B6, . . . , Bn are connected to the first node N1, and the cathodes of the even-numbered batteries B2, B4, B6, . . . , Bn and the anodes of the odd-numbered batteries B1, B3, B5, . . . , Bn are connected to the second node N2.

The divert change unit 18 functions to separate the polarities of each battery connected thereto through the connection switch unit 16, and to change the positions of the cathode and anode of the battery depending on the separated polarities. For this operation, the divert change unit 18 includes a first divert change E1 and a second divert change E2, the first ends of which are connected in common to the first node N1, and a third divert change E3 and a fourth divert change E4, the first ends of which are connected in common to the second node N2. In this case, the second ends of the first divert change E1 and the third divert change E3 are connected in common to a third node N3, and the second ends of the second divert change E2 and the fourth divert change E4 are connected in common to a fourth node N4. Accordingly, the first divert change E1 and the third divert change E3 function to collect the cathodes of the N batteries at the single position N3, and the second divert change E2 and the fourth divert change E4 function to the anodes of the N batteries at the single position N4. That is, the cathodes of the odd-numbered batteries B1, B3, B5, . . . , Bn−1 and the cathodes of the even-numbered batteries B2, B4, B6, . . . , Bn are connected to the third node N3 through the first divert change E1 and the third divert change E3, and the anodes of the even-numbered batteries B2, B4, B6, Bn and the anodes of the odd-numbered batteries B1, B3, B5, . . . , Bn−1 are connected to the fourth node N4 through the second divert change E2 and the fourth divert change E4. Accordingly, the cathodes of the N batteries are connected to the third node N3, and the anodes of the N batteries are connected to the fourth node N4. In this case, both the first node N1 and the second node N2 may be formed between the connection switch unit 16 and the divert change unit 18, as shown in FIG. 2, or formed in either one of the connection switch unit 16 and the divert change unit 18.

The selection switch unit 20 selectively connects the cathode and anode of each battery, separated by the divert change unit 18, to the cathode and the anode of the voltage circuit 10, the resistance circuit 11, or the charging circuit 12 in response to a switching control signal provided by the control unit 22. For this operation, the selection switch unit 20 includes a first selection switch S1, a third selection switch S3 and a fifth selection switch S5, the first ends of which are connected in common to the third node N3, and a second selection switch S2, a fourth selection switch S4 and a sixth selection switch S6, the first ends of which are connected in common to the fourth node N4. In this case, the second ends of the first selection switch S1 and the second selection switch S2 are connected to the cathode and the anode of the voltage circuit 10, respectively, the second ends of the third selection switch S3 and the fourth selection switch E4 are connected to the cathode and anode of the resistance circuit 11, respectively, and the second ends of the fifth selection switch S5 and the sixth selection switch S6 are connected to the cathode and anode of the charging circuit 12, respectively.

The control unit 22 controls the state of the display unit 24 in response to the discharging and charging signals provided by the resistance circuit 11 and the charging circuit 12 while controlling the switching operation of the switches C1 to Cn+1, E1 to E4, and S1 to S6, included in the connection switch unit 16, the divert change unit 18, and the selection switch unit 20. In other words, the control unit 22 controls the switches C1 to Cn+1, E1 to E4, and S1 to S6, included in the connection switch unit 16, the divert change unit 18, and the selection switch unit 20, so that the voltage circuit 10 can sequentially measure the voltages of the first battery B1 to the N-th battery Bn. Further, the control unit 22 controls the switches C1 to Cn+1, E1 to E4, and S1 to S6 included in the connection switch unit 16, the divert-change unit 18, and the selection switch unit 20 so that the resistance circuit 11 or the charging circuit 12 can discharge or charge the voltage of a selected battery depending on the voltage value supplied by the voltage circuit 10. Such a control method performed by the control unit 22 will be described later.

The display unit 24 displays the charged or discharged state of batteries in response to a control signal provided by the control unit 22. Such a display unit 24 can be implemented not only using a single device, such as a Light Emitting Diode (LED), in order to display the charged or discharged state using a single light source, but also using a display device, such as a Anode Ray Tube (CRT), a Plasma Display Panel (PDP), or a Liquid Crystal Display (LCD), in order to indicate the charged or discharged state in the form of a graph. In this case, when the display unit 24 is implemented using a single device, such as an LED, the discharging and charging signals, provided by the resistance circuit 11 and the charging circuit 12, can be directly provided to the display unit 24 without passing through the control unit 22.

Hereinbefore, in the battery test apparatus according to the first embodiment of the present invention, when the switches C1 to Cn+1, E1 to E4, and St to S6, included in the connection switch unit 16, the divert change unit 18, and the selection switch unit 20 are manually controlled, that is, controlled with a user's hand, the control unit 22 may be omitted. In this case, the display unit 24 directly receives a discharging signal and a charging signal from the resistance circuit 11 and the charging circuit 12, and thus displays discharged and charged states. Further, in the battery test apparatus according to the first embodiment of the present invention, the first node N1 to the fourth node N4 can be omitted. Accordingly, the second ends of the odd-numbered connection switches C1, C3, C5, . . . , Cn+1, among the N+1 connection switches, which constitute the connection switch unit 16, are connected in common to each other, and are thus coupled both to the first end of the first divert change E1 and to the first end of the second divert change E2. Further, the second ends of the even-numbered connection switches C2, C4, C6, . . . , Cn are connected in common to each other, and are thus coupled both to the first end of the third divert change E3 and to the first end of the fourth divert change E4. Further, the second ends of the first divert change E1 and the third divert change E3 are connected in common to each other, and are thus coupled to the first ends of the first selection switch S1, the third selection switch S3, and the fifth selection switch S5, and the second ends of the second divert change E2 and the fourth divert change E4 are connected in common to each other, and are thus coupled to the first ends of the second selection switch S2, the fourth selection switch S4, and the sixth selection switch S6. Finally, in the battery test apparatus according to the first embodiment of the present invention, voltage circuits 10, resistance circuits 11 and charging circuits 12 can each be used in a number ranging from 2 to N. Accordingly, the divert change unit 18 and the selection switch unit 20 further include switches for separating and changing the polarities of batteries selected by the connection switch unit 16, and a plurality of switches to be connected to the cathodes and anodes of respective voltage circuits 10, resistance circuits 11, and charging circuits 12, respectively.

A method of controlling the battery test apparatus according to the first embodiment of the present invention is described below.

First, when the voltage of the first battery B1 is intended to be measured, the control unit 22 controls the connection switch unit 16, the divert change unit 18, and the selection switch unit 20 so that the first connection switch C1, the second connection switch C2, the first divert change E1, the fourth divert change E4, the first selection switch S1, and the second selection switch S2 are turned on. Accordingly, the voltage circuit 10 measures the voltage of the first battery B1 and supplies the measured voltage to the control unit 22. In this case, when the voltage measured by the voltage circuit 10 is less than a reference voltage (for example, 3.6V), the control unit 22 controls the connection switch unit 16, the divert change unit 18, and the selection switch unit so that the first connection switch C1, the second connection switch C2, the first divert change E1, the fourth divert change E4, the fifth selection switch S5, and the sixth selection switch S6 are turned on. Accordingly, the charging circuit 12 provides a charging signal to the control unit 22 while charging a selected battery. In this case, the control unit 22 controls the display unit 24 so that the charged state is displayed on the display unit 24. Further, when the voltage of the first battery B1 becomes equal to the reference voltage, the control unit 22 controls the connection switch unit 16, the divert change unit 18, and the selection switch unit 20 so that the third connection switch C3, the second divert change E2, the third divert change E3, the first selection switch S1, and the second selection switch S2 are turned on while controlling the connection switch unit 16, the divert change unit 18, and the selection switch unit 20, so that the second connection switch C2 is maintained in a turned-on state, and the first connection switch C1, the first divert change E1, the fourth divert change E4, the fifth selection switch S5, and the sixth selection switch S6 are turned off. Accordingly, the voltage circuit 10 measures the voltage of the second battery B2.

In contrast, when the voltage of the first battery B1, measured by the voltage circuit 10, is greater than the reference voltage, the control unit 22 controls the connection switch unit 16, the divert change unit 18, and the selection switch unit 20 so that the first connection switch C1, the second connection switch C2, the first divert change E1, the fourth divert change E4, the third selection switch S3, and the fourth selection switch S4 are turned on. Accordingly, the resistance circuit 12 provides a discharging signal to the control unit 22 while discharging a selected battery. In this case, the control unit 22 controls the display unit 24 so that the discharged state is displayed on the display unit 24. Further, when the voltage of the first battery B1 becomes equal to the reference voltage, the control unit 22 controls the connection switch unit 16, the divert change unit 18, and the selection switch unit 20 so that the third connection switch C3, the second divert change E2, the third divert change E3, the first selection switch S1, and the second selection switch S2 are turned on while controlling the connection switch unit 16, the divert change unit 18, and the selection switch unit 20 so that the second connection switch C2 is maintained in a turned-on state, and the first connection switch C1, the first divert change E1, the fourth divert change E4, the third selection switch S3, and the fourth selection switch S4 are turned off. Accordingly, the voltage circuit 10 measures the voltage of the second battery B2.

Through the above method, the battery test apparatus according to the first embodiment of the present invention sequentially measures the voltages of the first to N-th batteries B1 to Bn, and charges or discharges batteries depending on the measured voltages.

In this case, when the switches C1 to Cn+1, E1 to E4, and S1 to S6 are manually controlled, that is, controlled with a user's hand, the voltage state of the batteries must be checked when the batteries B1 to Bn are charged or discharged, thus the first selection switch S1 and the second selection switch S2 must always be turned on.

Figure 3:
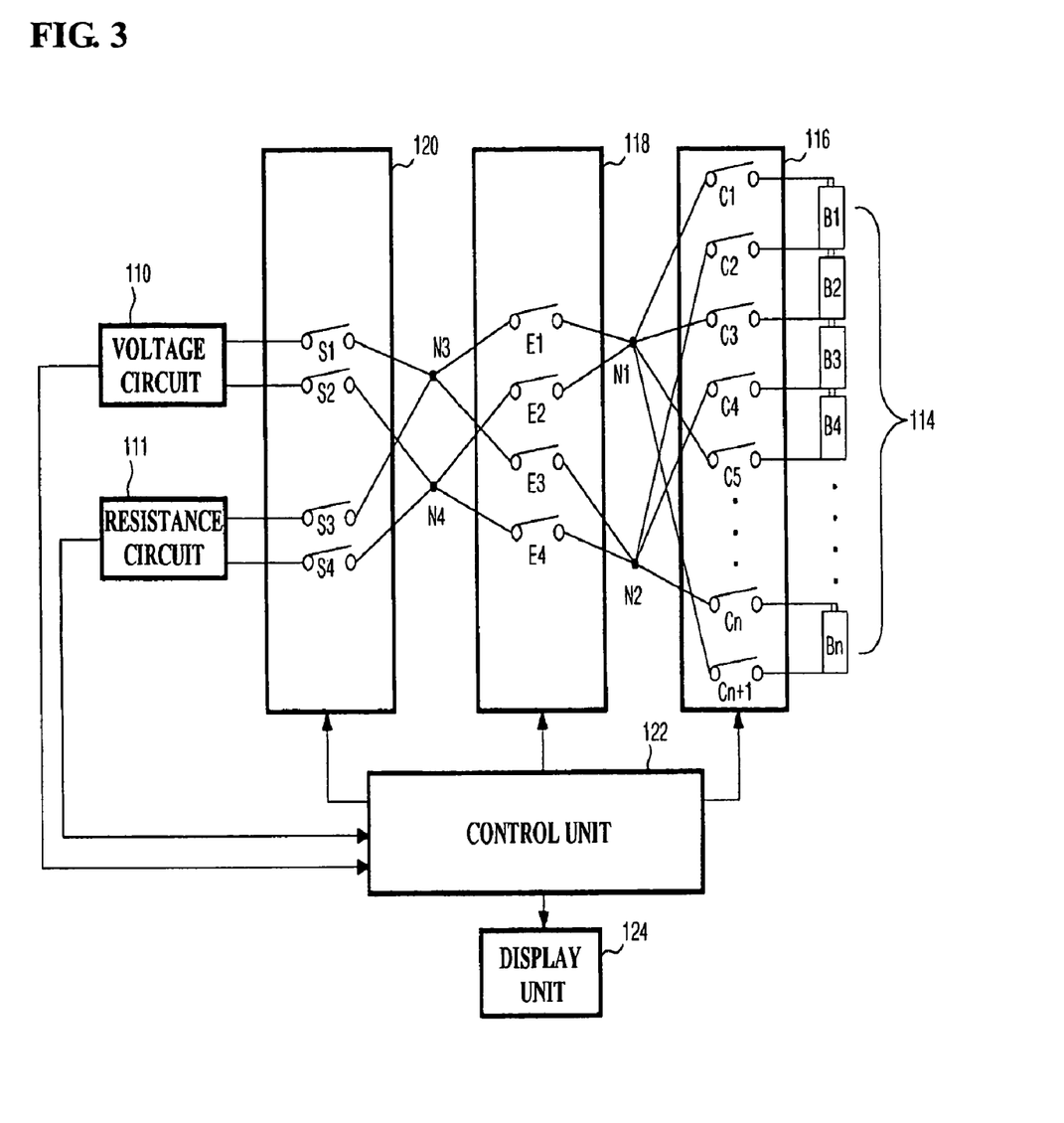
FIG. 3 is a diagram showing an apparatus for testing batteries according to a second embodiment of the present invention.

FIG. 3 is a diagram showing an apparatus for testing batteries according to a second embodiment of the present invention.

Referring to FIG. 3, the battery test apparatus according to the second embodiment of the present invention includes a voltage circuit 110, a resistance circuit 111, a connection switch unit 116, a divert change unit 118, a selection switch unit 120, a control unit 122, and a display unit 124. In this case, the construction and operation of the voltage circuit 110, the resistance circuit 111, the connection switch unit 116, and the divert change unit 118 are the same as that of the voltage circuit 10, the resistance circuit 11, the connection switch unit 16, and the divert change unit 18 according to the first embodiment of the present invention, and thus the above description is used as a detailed description thereof.

The selection switch unit 120 selectively connects the cathode and anode of each battery, separated by the divert change unit 118, to the cathode and anode of the voltage circuit 110 or the resistance circuit 111 in response to a switching control signal provided by the control unit 122. For this operation, the selection switch unit 120 includes a first selection switch S1 and a third selection switch S3, the first ends of which are connected in common to a third node N3, and a second selection switch S2 and a fourth selection switch S4, the first ends of which are connected in common to a fourth node N4. In this case, the second ends of the first selection switch S1 and the second selection switch S2 are connected to the cathode and anode of the voltage circuit 110, respectively, and the second ends of the third selection switch S3 and the fourth selection switch S4 are connected to the cathode and anode of the resistance circuit 111, respectively.

The control unit 122 controls the state of the display unit 124 in response to a discharging signal provided by the resistance circuit 111 while controlling the switching operation of the switches C1 to Cn+1, E1 to E4, and S1 to S4, included in the connection switch unit 116, the divert change unit 118, and the selection switch unit 120. In other words, the control unit 122 controls the switches C1 to Cn+1, E1 to E4, and S1 to S4 included in the connection switch unit 116, the divert change unit 118, and the selection switch unit 120 so that the voltage circuit 110 can sequentially measure the voltages of first to N-th batteries. Further, the control unit 122 controls the switches C1 to Cn+1, E1 to E4, and S1 to S4, included in the connection switch unit 116, the divert change unit 118, and the selection switch unit 120 so that the resistance circuit 111 can discharge a selected battery depending on the voltage value provided by the voltage circuit 110. Such a control method, performed by the control unit 122, will be described later.

The display unit 124 displays the discharged state of batteries in response to a control signal provided by the control unit 122. Such a display unit can be implemented not only using a single device, such as a Light Emitting Diode (LED), in order to display the discharged state of batteries using a single light source, but also using a display device, such as a Anode Ray Tube (CRT), a Plasma Display Panel (PDP), or a Liquid Crystal Display (LCD), in order to indicate the discharged state in the form of a graph. In this case, when the display unit 124 is implemented using a single device, such as an LED, a discharging signal, provided by the resistance circuit 111, can be directly supplied to the display unit 124 without passing through the control unit 122.

In the battery test apparatus according to the second embodiment of the present invention, when the switches C1 to Cn+1, E1 to E4, and S1 to S4, included in the connection switch unit 116, the divert change unit 118, and the selection switch unit 120, are manually controlled, that is, controlled with a person's hand, the control unit 122 may be omitted. In this case, the display unit 124 directly receives a discharging signal from the resistance circuit 111, and thus displays the discharged state. Further, in the battery test apparatus according to the second embodiment of the present invention, the first node N1 to the fourth node N4 may be omitted. Accordingly, the second ends of the odd-numbered connection switch C1, C3, C5, . . . , Cn+1, among N+1 connection switches, which constitute the connection switch unit 116, are connected in common to each other and are thus coupled both to the first end of the first divert change E1 and to the first end of the second divert change E2. Further, the second ends of the even-numbered connection switch C2, C4, C6, . . . , Cn are connected in common to each other and are thus coupled both to the first end of the third divert change E3 and to the first end of the fourth divert change E4. Further, the second ends of the first divert change E1 and the third divert change E3 are connected in common to each other, and are thus coupled both to the first end of the first selection switch S1 and to the first end of the third selection switch S3. The second ends of the second divert change E2 and the fourth divert change E4 are connected in common to each other, and are thus coupled both to the first ends of the second selection switch S2 and the fourth selection switch S4. Finally, in the battery test apparatus according to the second embodiment of the present invention, voltage circuits 110 and resistance circuits 111 can each be used in a number ranging from 2 to N. Accordingly, the divert change unit 118 and the selection switch unit 120 further include a switch for separating and changing the polarities of batteries selected by the connection switch unit 116, and a plurality of switches to be connected to the cathodes and anodes of respective voltage circuits 110 and resistance circuits 111, respectively.

A method of controlling the battery test apparatus according to the second embodiment of the present invention is described below.

First, when the voltage of the first battery B1 is intended to be measured, the control unit 122 controls the connection switch unit 116, the divert change unit 118, and the selection switch unit 120 so that the first connection switch C1, the second connection switch C2, the first divert change E1, the fourth divert change E4, the first selection switch S1, and the second selection switch S2 are turned on. Accordingly, the voltage circuit 110 measures the voltage of the first battery B1, and supplies the measured voltage to the control unit 122. In this case, when the voltage of the first battery B1, measured by the voltage circuit 110, is greater than a reference voltage, the control unit 122 controls the connection switch unit 116, the divert change unit 118, and the selection switch unit 120, so that the first connection switch C1, the second connection switch C2, the first divert change E1, the fourth divert change E4, the third selection switch S3, and the fourth selection switch S4 are turned on. Accordingly, the resistance circuit 111 provides a discharging signal to the control unit 122 while discharging a selected battery. In this case, the control unit 122 controls the display unit 124 so that the discharged state is displayed on the display unit 124. Further, when the voltage of the first battery B1 becomes equal to the reference voltage, the control unit 122 controls the connection switch unit 116, the divert change unit 118, and the selection switch unit 120 so that the third connection switch C3, the second divert change E2, the third divert change E3, the first selection switch S1, and the second selection switch S2 are turned on while controlling the connection switch unit 116, the divert change unit 118, and the selection switch unit 120 so that the second connection switch C2 is maintained in a turned-on state, and the first connection switch C1, the first divert change E1, the fourth divert change E4, the third selection switch S3, and the fourth selection switch S4 are turned off. Accordingly, the voltage circuit 110 measures the voltage of the second battery B2.

Through the above method, the battery test apparatus according to the second embodiment of the present invention sequentially measures the voltages of the first to N-th batteries, and discharges a battery having a measured voltage greater than the reference voltage. Further, in the battery test apparatus according to the second embodiment of the present invention, voltage circuits 110 and resistance circuits 111 can each be used in a number ranging from 2 to N. In this case, the selection switch unit 120 further includes switches to be connected to the cathodes and anodes of respective voltage circuits 110 and resistance circuits 111.

In this case, when the switches C1 to Cn+1, E1 to E4, and S1 to S4 are manually controlled, that is, controlled with a user's hand, the voltage states of the batteries B1 to Bn must be checked when the batteries B1 to Bn are discharged, thus the first selection switch S1 and the second selection switch S2 must always be turned on.

Figure 4:
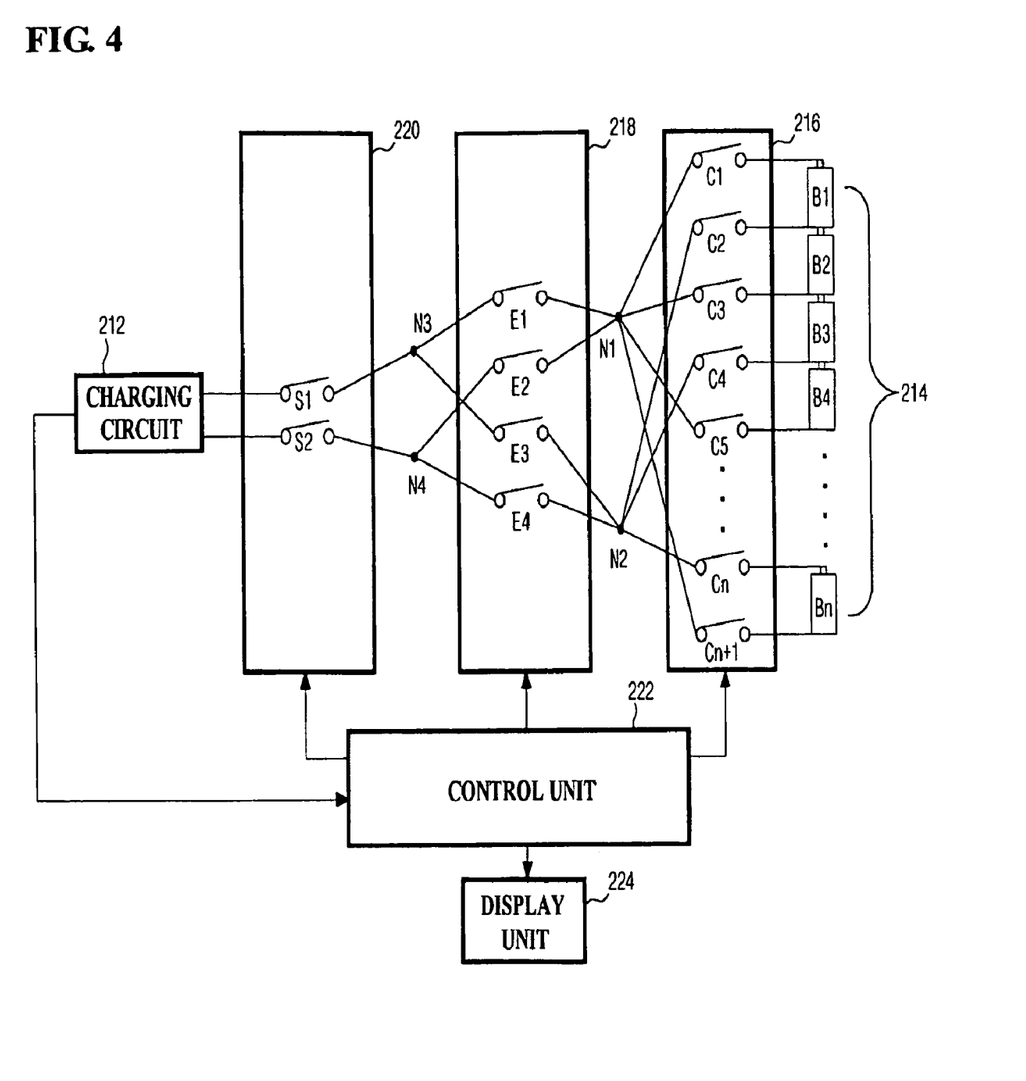
FIG. 4 is a diagram showing an apparatus for testing batteries according to a third embodiment of the present invention.

FIG. 4 is a diagram showing an apparatus for testing batteries according to a third embodiment of the present invention.

Referring to FIG. 4, the battery test apparatus according to the third embodiment of the present invention includes a charging circuit 212, a connection switch unit 216, a divert change unit 218, a selection switch unit 220, a control unit 222, and a display unit 224. In this case, the connection switch unit 216 and the divert change unit 218 are the same components as the connection switch unit 16 and the divert change unit 18 of the battery test apparatus according to the first embodiment of the present invention, and are operated using the same method, and thus the above description is used as a detailed description thereof.

The charging circuit 212 sequentially charges N batteries B1 to Bn, having voltages less than a reference voltage, to the reference voltage. That is, voltages corresponding to the reference voltage are charged in the N batteries B1 to Bn by the charging circuit 212.

The selection switch unit 220 connects the cathode and anode of each battery, separated by the divert change unit 218, to the cathode and anode of the charging unit 212, respectively, in response to a switching control signal provided by the control unit 222. For this operation, the selection switch unit 220 includes a first selection switch S1 connected between the cathode of the charging circuit 212 and a third node N3, and a second selection switch S2 connected between the anode of the charging circuit 212 and a fourth node N4.

The control unit 222 controls the state of the display unit 224 in response to a charging signal provided by the charging circuit 212 while controlling the switching operation of the switches C1 to Cn+1, E1 to E4, and S1 to S2 included in the connection switch unit 216, the divert change unit 218, and the selection switch unit 220. In other words, the control unit 222 controls the display unit 224 so that the charged state is displayed on the display unit 224 while controlling the switches C1 to Cn+1, E1 to E4, and S1 to S2 included in the connection switch unit 216, the divert change unit 218, and the selection switch unit 220 so that the charging circuit 212 can sequentially charge the first to N-th batteries B1 to Bn. The control method, performed by the control unit 222, will be described later.

The display unit 224 displays the charged state of the batteries in response to a control signal provided by the control unit 222. Such a display unit 224 can be implemented not only using a single device, such as a Light Emitting Diode (LED), in order to display the charged state of a battery using a single light source, but also using a display device, such as a Anode Ray Tube (CRT), a Plasma Display Panel (PDP), or a Liquid Crystal Display (LCD), in order to indicate the charged state in the form of a graph. In this case, when the display unit 224 is implemented using a single device, such as an LED, a charging signal, provided by the charging circuit 212, can be directly provided to the display unit 224 without passing through the control unit 222.

In the battery test apparatus according to the third embodiment of the present invention, when the switches C1 to Cn+1, E1 to E4, and S1 to S2 included in the connection switch unit 216, the divert change unit 218, and the selection switch unit 220 are manually controlled, that is, when a user performs switching with his or her hand, the control unit 222 may be omitted. At this time, the display unit 224 directly receives a charging signal from the charging circuit 212, and thus displays the charged state. Further, in the battery test apparatus according to the third embodiment of the present invention, the first to fourth nodes N1 to N4 can be omitted. Accordingly, the second ends of the odd-numbered connection switches C1, C3, C5, . . . , Cn+1, among the N+1 connection switches, which constitute the connection switch unit 216, are connected in common to each other, and are thus coupled both to the first end of the first divert change E1 and to the first end of the second divert change E2. Further, the second ends of the even-numbered connection switch C2, C4, C6, . . . , Cn are connected in common to each other, and are thus coupled both to the first end of the third divert change E3 and to the first end of the fourth divert change E4. Further, the second ends of the first divert change E1 and the third divert change E3 are connected in common to each other and are thus coupled to the first end of the first selection switch S1, and the second ends of the second divert change E2 and the fourth divert change E4 are connected in common to each other, and are thus coupled to the first end of the second selection switch S2. Finally, in the battery test apparatus according to the third embodiment of the present invention, charging circuits 212 can be used in a number ranging from 2 to N. Accordingly, the divert change unit 218 and the selection switch unit 220 further include a switch for separating and changing the polarities of batteries selected by the connection switch unit 216, and a plurality of switches to be connected to the cathodes and anodes of the charging circuits 212.

A method of controlling the battery test apparatus according to the third embodiment of the present invention is described below.

First, when the first battery B1 is intended to be charged, the control unit 222 controls the connection switch unit 216, the divert change unit 218, and the selection switch unit 220 so that the first connection switch C1, the second connection switch C2, the first divert change E1, the fourth divert change E4, the first selection switch S1, and the second selection switch S2 are turned on. Accordingly, the charging circuit 212 charges the first battery B1 and provides a charging signal to the control unit 222. Therefore, the control unit 222 controls the display unit 224 so that the charged state is displayed on the display unit. Therefore, when the voltage of the first battery B1 becomes equal to the reference voltage, the control unit 222 controls the connection switch unit 216, the divert change unit 218, and the selection switch unit 220 so that the second connection switch C2, the first selection switch S1, and the second selection switch S2 are maintained in a turned-on state, so that the first connection switch C1, the first divert change E1, and the fourth divert change E4 are turned off, and so that the third connection switch C3, the second divert change E2, and the third divert change E3 are turned on. Accordingly, the charging circuit 212 charges the second battery B2.

Through the above method, the battery test apparatus according to the third embodiment of the present invention sequentially charges the first to N-th batteries B1 to Bn.

The invention claimed is:

1. An apparatus for testing batteries, comprising:
at least one voltage circuit for measuring voltages of N batteries;
at least one resistance circuit, which is separate from the voltage circuit, for decreasing voltages of batteries into the reference voltage by discharging voltages of batteries, which are greater than a reference voltage, among the N batteries;
a connection switch unit connected to the N batteries and adapted to select any one of the N batteries;
a divert switch unit for separating polarities of each battery connected thereto through the connection switch unit and changing positions of a cathode and an anode of the battery depending on separated polarities;
a selection switch unit for selectively connecting the cathode and anode of the battery, separated by the divert switch unit, to a cathode and an anode of the voltage circuit or the resistance circuit; and
a control unit for controlling the connection switch unit, the divert switch unit, and the selection switch unit, which controls the resistance circuit and decreases the voltage of battery to the reference voltage by discharging voltage of battery when the voltage measured by the voltage circuit is greater than a reference voltage, whereby the voltage circuit transmits the measured voltage of the N batteries into the above control unit.

2. The apparatus according to claim 1, wherein:
the connection switch unit comprises first to N-th connection switches, first ends of which are connected to cathodes of the N batteries, and an N+1-th connection switch, a first end of which is connected to an anode of the N-th battery, and
second ends of odd-numbered connection switches, among the N+1 connection switches, and second ends of even-numbered connection switches are connected in common to different positions, respectively.

3. The apparatus according to claim 2, wherein the divert switch unit comprises:
a first divert switch, a first end of which is connected to second ends of the odd-numbered connection switches, thus collecting cathodes of odd-numbered batteries at a single position;
a second divert switch, a first end of which is connected to second ends of the odd-numbered connection switches, thus collecting anodes of the odd-numbered battery at a single position;
a third divert switch, a first end of which is connected to second ends of the even-numbered connection switches, thus collecting cathodes of even-numbered batteries at a single position; and
a fourth divert Switch, a first end of which is connected to second ends of the even-numbered connection switches, thus collecting anodes of the even-numbered batteries at a single position.

4. The apparatus according to claim 3, wherein the second ends of the odd-numbered connection switches and first ends of the first divert switch and the second divert switch are connected in common to a first node, and the second ends of the even-numbered connection switches and first ends of the third divert switch and the fourth divert switch are connected in common to a second node.

5. The apparatus according to claim 4, wherein the first and second nodes are formed in either one of the connection switch unit and the divert switch unit.

6. The apparatus according to claim 4, wherein the first and second nodes are formed between the connection switch unit and the divert switch unit.

7. The apparatus according to claim 4, wherein second ends of the first divert switch and the third divert switch are connected in common to each other, and second ends of the second divert switch and the fourth divert switch are connected in common to each other.

8. The apparatus according to claim 3, wherein the selection switch unit comprises:
a first selection switch, a first end of which is connected to second ends of the first divert switch and the third divert switch, and a second end of which is connected to an cathode of the voltage circuit;
a second selection switch, a first end of which is connected to second ends of the second divert switch and the fourth divert switch, and a second end of which is connected to a anode of the voltage circuit;
a third selection switch, a first end of which is connected to second ends of the first divert switch and the third divert switch, and a second end of which is connected to an cathode of the resistance circuit; and
a fourth selection switch, a first end of which is connected to second ends of the second divert switch and the fourth divert switch, and a second end of which is connected to a anode of the resistance circuit.

9. The apparatus according to claim 8, wherein second ends of the first divert switch and the third divert switch and first ends of the first selection switch and the third selection switch are connected in common to a third node, and second ends of the second divert switch and the fourth divert switch and first ends of the second selection switch and the fourth selection switch are connected in common to a fourth node.

10. The apparatus according to claim 9, wherein the third and fourth nodes are formed in either one of the divert switch unit and the selection switch unit.

11. The apparatus according to claim 9, wherein the third and fourth nodes are formed between the divert switch unit and the selection switch unit.

12. The apparatus according to claim 4, further comprising:
- a display unit for displaying discharged states of the batteries, wherein
- the control unit controls the display unit in response to a discharging signal provided by the resistance circuit.

13. A method of testing batteries, comprising the steps of:
- selecting any one of N batteries by the control unit's controlling of the connection switch Unit, divert switch unit, and selection switch unit;
- measuring a voltage of the selected battery and transmitting it to the control unit by the voltage circuit; and
- controlling the resistance circuit which is separate from the voltage circuit by the control unit and decreasing the voltage of the battery to the reference voltage by discharging the voltage of the battery when the measured voltage is greater than a reference voltage.

14. The method according to claim 13, wherein the voltage measuring step comprises the step of sequentially measuring voltages of the N batteries in order from the first to N-th batteries.

15. The method according to claim 14, further comprising the step of separating polarities of the selected battery, and changing positions of a cathode and an anode of the selected battery depending on the separated polarities.

16. An apparatus for testing batteries, comprising:
- at least one voltage circuit for measuring voltages of N batteries;
- at least one resistance circuit, which is separate from the voltage circuit, for decreasing voltages of batteries into the reference voltage by discharging voltages of batteries, which are greater than a reference voltage, among the N batteries;
- a connection switch unit connected to the N batteries and adapted to select any one of the N batteries;
- a divert switch unit for separating polarities of each battery connected thereto through the connection switch unit and changing positions of a cathode and an anode of the battery depending on separated polarities;
- a selection switch unit for selectively connecting the cathode and anode of the battery, separated by the divert switch unit, to a cathode and an anode of the voltage circuit or the resistance circuit;
- at least one charging circuit for charging batteries, having voltages which are less than the reference voltage among the N batteries, to the reference voltage;
- a display unit for displaying charged and discharged states of the batteries; and
- a control unit for controlling the display unit in response to a discharging signal and a charging signal, which are provided by the resistance circuit and the charging circuit, respectively, while controlling the connection switch unit, the divert switch unit and the selection switch unit, which controls the resistance circuit and decreases the voltage of the battery to the reference voltage by discharging the voltage of battery when the measured voltage is greater than a reference voltage, whereby the voltage circuit transmits the measured voltage of the N batteries into the above control unit.

17. The apparatus according to claim 16, wherein:
- the connection switch unit comprises first to N-th connection switches, first ends of which are connected to cathodes of the N batteries, and an N+1-th connection switch, a first end of which is connected to an anode of the N-th battery, and
- second ends of odd-numbered connection switches, among the N+1 connection switches, and second ends of even-numbered connection switches are connected in common to different positions, respectively.

18. The apparatus according to claim 17, wherein the divert switch unit comprises:
- a first divert switch, a first end of which is connected to second ends of the odd-numbered connection switches, thus collecting cathodes of odd-numbered batteries at a single position;
- a second divert switch, a first end of which is connected to second ends of the odd-numbered connection switches, thus collecting anodes of the odd-numbered battery at a single position;
- a third divert switch, a first end of which is connected to second ends of the even-numbered connection switches, thus collecting cathodes of even-numbered batteries at a single position; and
- a fourth divert switch, a first end of which is connected to second ends of the even-numbered connection switches, thus collecting anodes of the even-numbered batteries at a single position.

19. The apparatus according to claim 18, wherein:
- the second ends of the odd-numbered connection switches and first ends of the first divert switch and the second divert switch are connected in common to a first node, and
- the second ends of the even-numbered connection switches and first ends of the third divert switch and the fourth divert switch are connected in common to a second node.

20. The apparatus according to claim 19, wherein the selection switch unit comprises:
- a first selection switch, a first end of which is connected to second ends of the first divert switch and the third divert switch, and a second end of which is connected to a cathode of the voltage circuit;
- a second selection switch, a first end of which is connected to second ends of the second divert switch and the fourth divert switch, and a second end of which is connected to an anode of the voltage circuit;
- a third selection switch, a first end of which is connected to second ends of the first divert switch and the third divert switch, and a second end of which is connected to a cathode of the resistance circuit;
- a fourth selection switch, a first end of which is connected to second ends of the second divert switch and the fourth divert switch, and a second end of which is connected to an anode of the resistance circuit;
- a fifth selection switch, a first end of which is connected to second ends of the first divert switch and the third divert switch, and a second end of which is connected to a cathode of the charging circuit; and
- a sixth selection switch, a first end of which is connected to second ends of the second divert switch and the fourth divert switch, and a second end of which is connected to an anode of the charging circuit.

21. The apparatus according to claim 19, wherein the first and second nodes are formed in either one of the connection switch unit and the divert switch unit.

22. The apparatus according to claim 19, wherein the first and second nodes are formed between the connection switch unit and the divert switch unit.

23. The apparatus according to claim 19, wherein second ends of the first divert switch and the third divert switch are connected in common to each other, and second ends of the second divert switch and the fourth divert switch are connected in common to each other.

24. The apparatus according to claim 16, wherein voltage circuits, resistance circuits, and charging circuits can each be used in a number ranging from 2 to N.

* * * * *